(12) United States Patent
Park

(10) Patent No.: US 7,723,220 B2
(45) Date of Patent: May 25, 2010

(54) METHOD OF FORMING COMPRESSIVE CHANNEL LAYER OF PMOS DEVICE USING GATE SPACER AND PMOS DEVICE HAVING A COMPRESSED CHANNEL LAYER

(75) Inventor: Jin Ha Park, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 596 days.

(21) Appl. No.: 11/637,359

(22) Filed: Dec. 11, 2006

(65) Prior Publication Data

US 2007/0141795 A1    Jun. 21, 2007

(30) Foreign Application Priority Data

Dec. 15, 2005    (KR) ............... 10-2005-0124084

(51) Int. Cl.
*H01L 21/425*    (2006.01)
(52) U.S. Cl. ................ 438/528; 438/595; 257/E21.248
(58) Field of Classification Search .............. 438/528, 438/595, 938; 257/E21.248
See application file for complete search history.

(56) References Cited

U.S. PATENT DOCUMENTS

| | | | |
|---|---|---|---|
| 6,555,839 B2 | 4/2003 | Fitzgerald | |
| 6,815,320 B2 * | 11/2004 | Kim et al. | 438/585 |
| 6,902,971 B2 * | 6/2005 | Grudowski | 438/218 |
| 2006/0014350 A1 * | 1/2006 | Wang et al. | 438/293 |

OTHER PUBLICATIONS

English Translation of German Office Action dated Feb. 15, 2008; German Patent Application No. 102006059427.4-33; German Patent Office, Germany.

* cited by examiner

*Primary Examiner*—Chandra Chaudhari
(74) *Attorney, Agent, or Firm*—The Law Offices of Andrew D. Fortney; Andrew D. Fortney

(57) ABSTRACT

A method of forming a compressive channel layer in a PMOS device and a PMOS device having a compressive channel layer are provided. The method includes (a) forming a buffer oxide layer on a silicon semiconductor substrate having a gate oxide layer and a gate electrode thereon, (b) forming a silicon nitride layer on the buffer oxide layer, (c) implanting impurities into the silicon nitride layer, and (d) etching or patterning the silicon nitride layer and the buffer oxide layer into which impurities are implanted to form gate spacers on sidewalls of the gate electrode.

11 Claims, 8 Drawing Sheets

METHOD OF FORMING COMPRESSIVE CHANNEL LAYER OF PMOS DEVICE USING GATE SPACER AND PMOS DEVICE HAVING A COMPRESSED CHANNEL LAYER

This application claims the benefit of Korean Application No. 10-2005-0124084, filed on Dec. 15, 2005, which is incorporated by reference herein in its entirety.

BACKGROUND OF THE INVENTION

1. Field of the Invention

The present invention relates to a method of manufacturing a semiconductor device. More specifically, the present invention relates to a method of forming a compressive channel layer of a p-type metal oxide semiconductor (PMOS) device and to a PMOS device having a compressive channel layer.

2. Description of the Related Art

As semiconductor devices become more highly integrated and the speed of the semiconductor device increases, a thinner gate oxide layer and a higher driving current are beneficial. However, as the size of the device is reduced, a gate voltage may be reduced, and a driving current may be reduced in proportion to the gate voltage and/or a breakdown voltage of a gate dielectric. Under certain conditions, the device performance may be degraded due to an increased incidence of hot carrier injection (HCI). This may occur when the size of the device is reduced, but the voltage applied to the gate of the device is not proportionately reduced.

In order to solve the problem, a method of improving the mobility of a carrier by applying stress to silicon has recently been developed. As a typical example, a method of using a Si—Ge layer having different lattice constant from the crystal of a silicon layer has been widely used. In this method, a Si—Ge epitaxial layer is grown on a Si substrate, and an epitaxial Si layer is grown thereon to apply stress to the upper silicon layer that constitutes the channel layer of the device. In the normal crystal structure of silicon, atoms exist at the summits of a regular hexahedral structure. Meanwhile, a compressed silicon substrate receives compressive stress in a direction parallel to the surface thereof so that the compressed silicon substrate has a modified rectangular crystal structure. When the crystal structure is compressed by external force, the electrical and physical characteristics of the silicon are changed, so that the mobility of the carrier that moves therein improves. As a result, the speed and performance of the semiconductor device are improved.

However, in order to selectively form a Si—Ge layer only in PMOS devices (that is, in order to separate the PMOS devices from n-type metal oxide semiconductor [NMOS] devices), an additional oxidation process must performed. As a result, the manufacturing process is relatively complicated, and the manufacturing cost of the semiconductor device increases. Furthermore, since the Si—Ge layer reduces the band gap of the silicon channel layer, when the semiconductor device is operated, a leakage current may increase.

SUMMARY OF THE INVENTION

The present invention has been made to solve the above problems occurring in the related art, and therefore, it is an object of the present invention to provide a compressive channel layer in a PMOS device by simple processes and at a low price.

According to one aspect of the present invention, there is provided a method of forming a compressive channel layer of a PMOS device. The method includes the steps of (a) forming a buffer oxide layer on a silicon semiconductor substrate having a gate oxide layer and a gate electrode thereon, b) forming a silicon nitride layer on the buffer oxide layer, c) implanting impurities into the silicon nitride layer, and d) patterning or etching the silicon nitride layer and the buffer oxide layer (into which impurities are implanted in the silicon nitride layer) to form gate spacers on sidewalls of the gate electrode.

The impurities implanted preferably have the same number of valence electrons as silicon. Therefore, the impurities preferably comprise Ge. The compressive stress imparted on the silicon nitride layer due to the implantation of impurities is transmitted to the substrate under the silicon nitride layer to compress a channel layer or region in the silicon substrate under the gate electrode.

The PMOS device includes gate spacers on a silicon semiconductor substrate, including a buffer oxide layer on sidewalls of a gate electrode and a silicon nitride layer on the buffer oxide layer and compressed (e.g., by the implantation of impurities). A channel layer in the silicon substrate under the gate electrode can be compressed by the impurity-implanted silicon nitride layer to be parallel with the surface of the substrate.

The above objects and other features and advantages of the present invention will be more apparent from the following detailed description, taken in conjunction with the accompanying drawings.

BRIEF DESCRIPTION OF DRAWINGS

FIGS. 2A and 2B are graphs illustrating results of measuring electrical characteristics of the PMOS device having a compressive channel layer as compared to an otherwise identical PMOS device not having the compressive channel layer of the present invention, wherein FIG. 2A is a gate voltage Vth-driving current Idr graph, and FIG. 2B is an "off state" current Ioff-driving current Idr graph.

DETAILED DESCRIPTION OF THE INVENTION

Advantages and features of the present invention will be apparent by referring to embodiments described below in detail in connection with the accompanying drawings.

Referring to FIGS. 1A to 1F, a method of forming a compressive silicon channel layer in a PMOS device will be described as follows.

Figure 1A:
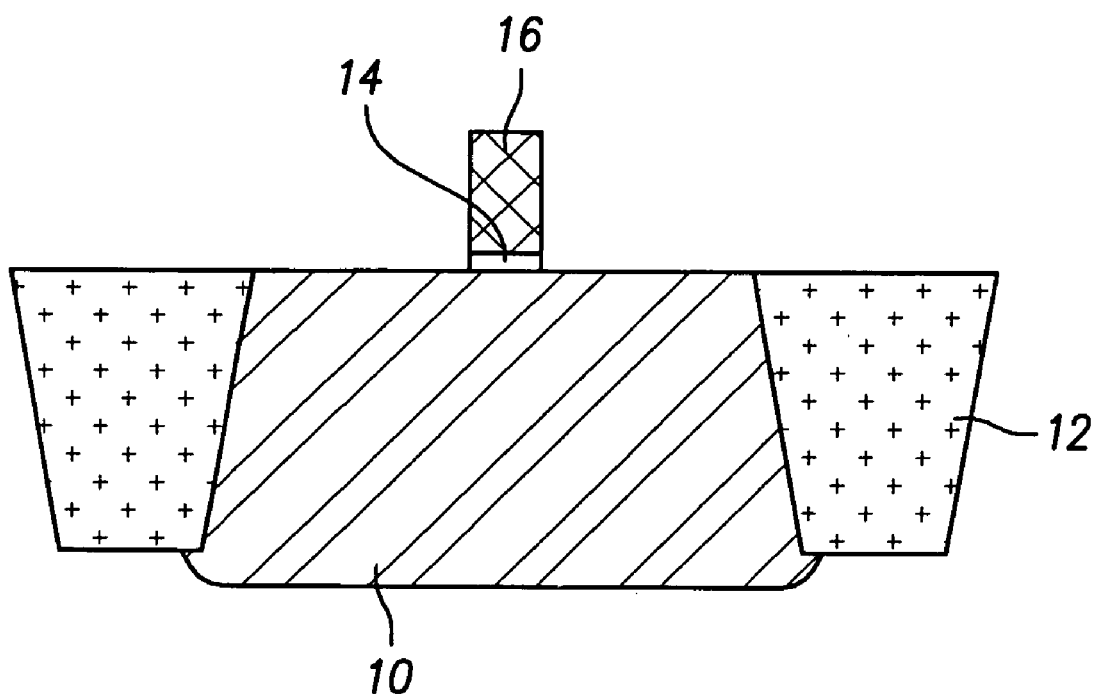
FIGS. 1A to 1F are sectional views illustrating processing steps of forming a compressive silicon channel layer in a PMOS device according to an embodiment of the present invention.

First, as illustrated in FIG. 1A, a silicon semiconductor substrate 10 on which a device isolation layer 12, a gate oxide layer 14, and a gate electrode 16 are formed is provided. The device isolation layer 12 distinguishes and/or defines an active device region where a PMOS semiconductor device is to be formed in the substrate 10. In FIG. 1A, although not shown, a lightly doped drain (LDD) region doped with impurities in low density can be formed in the active device region, generally in areas not covered (or masked) by the gate electrode 16.

Figure 1B:
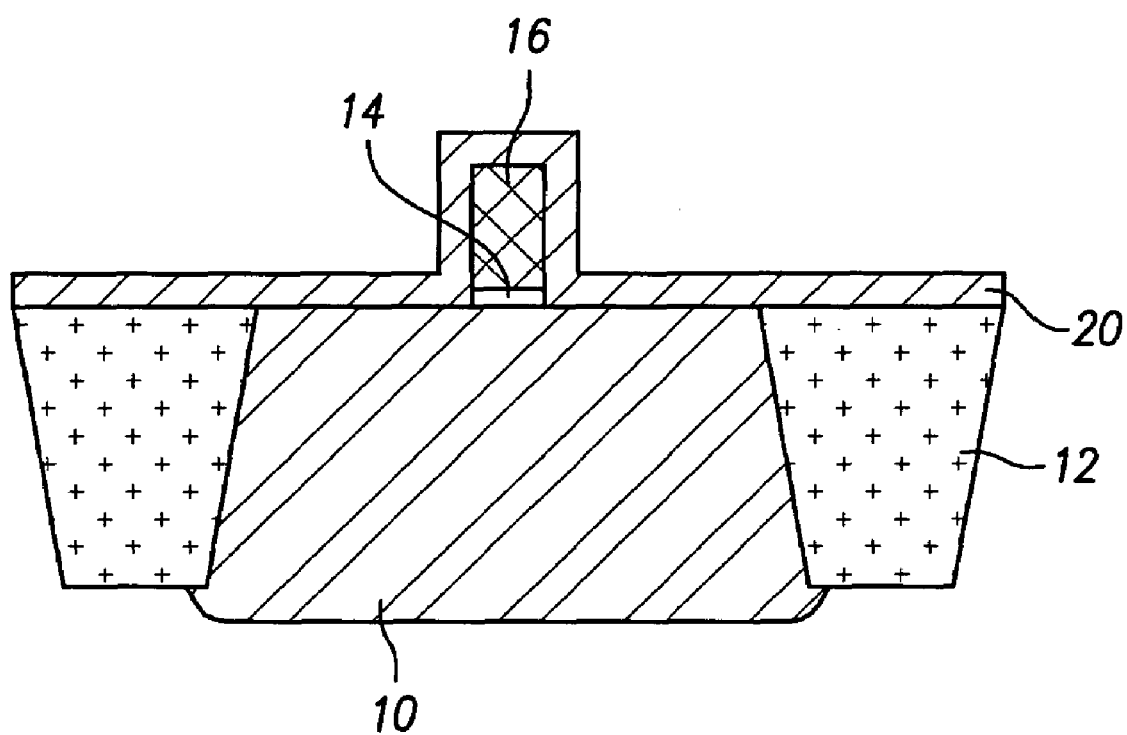

Then, as illustrated in FIG. 1B, a buffer oxide layer 20 is formed on the entire surface of the substrate 10, including the gate electrode 16, to a thickness of about 200 Å. The buffer oxide layer 20 is adapted to prevent damage that could otherwise be imparted to the substrate if a subsequent silicon nitride layer (refer to layer 22 of FIG. 1C) would have been directly formed on a silicon substrate. Thus, the buffer oxide layer 20, which generally comprises a silicon oxide, generally has a thickness sufficient to reduce or prevent damage to the substrate as a result of subsequently forming a silicon nitride layer thereon. The buffer oxide layer 20 can be formed by a common or conventional oxide layer forming method, for example, by a chemical vapor deposition (CVD) method in which tetraethyl orthosilicate (TEOS) is used as a source material.

Figure 1C:
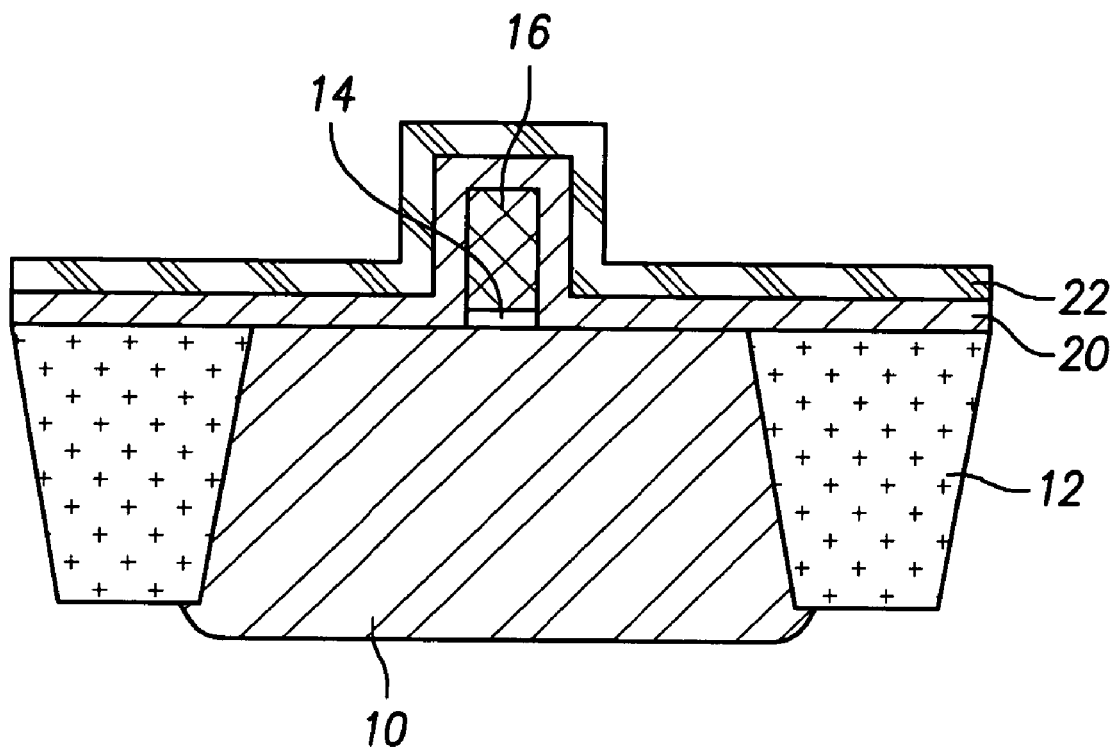
Figure 1D:
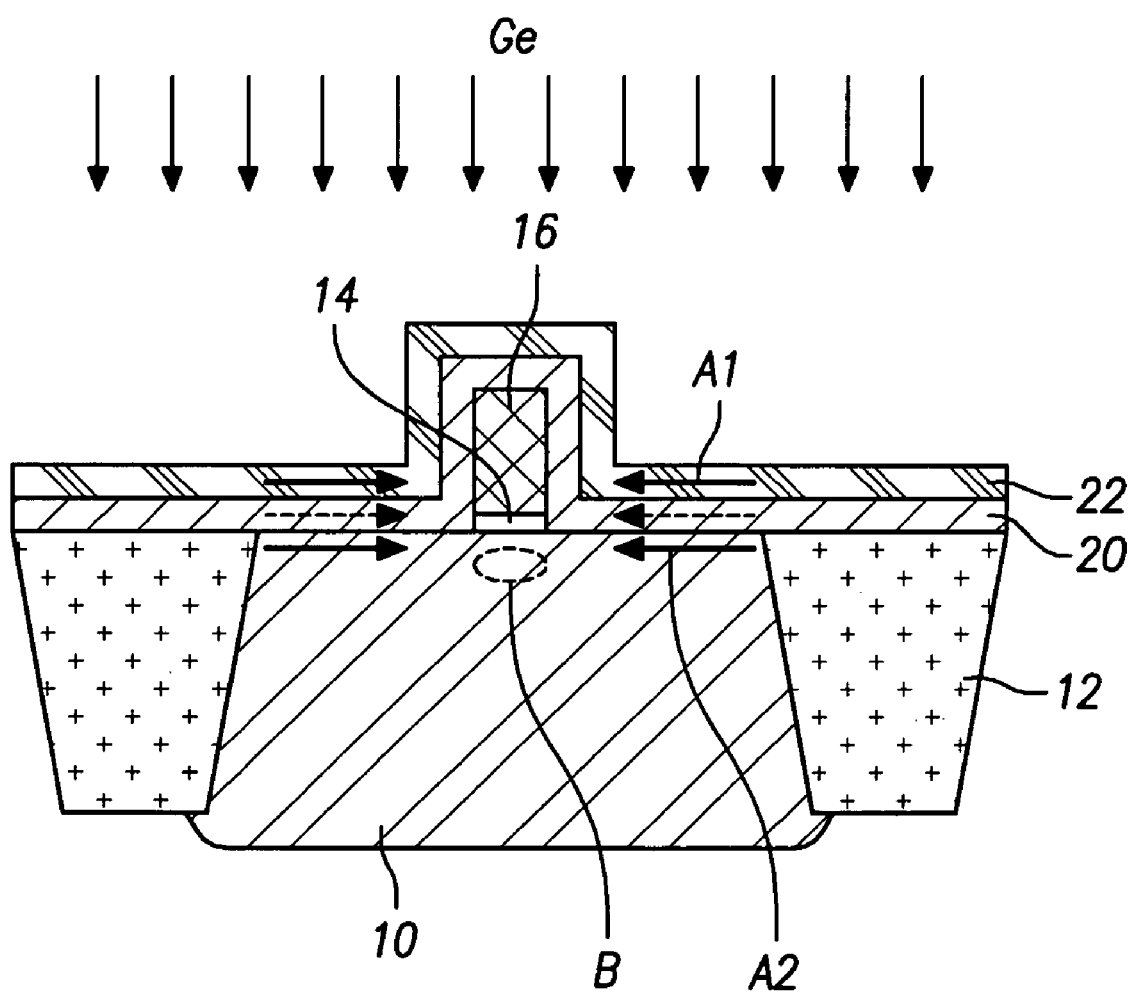
Figure 1E:
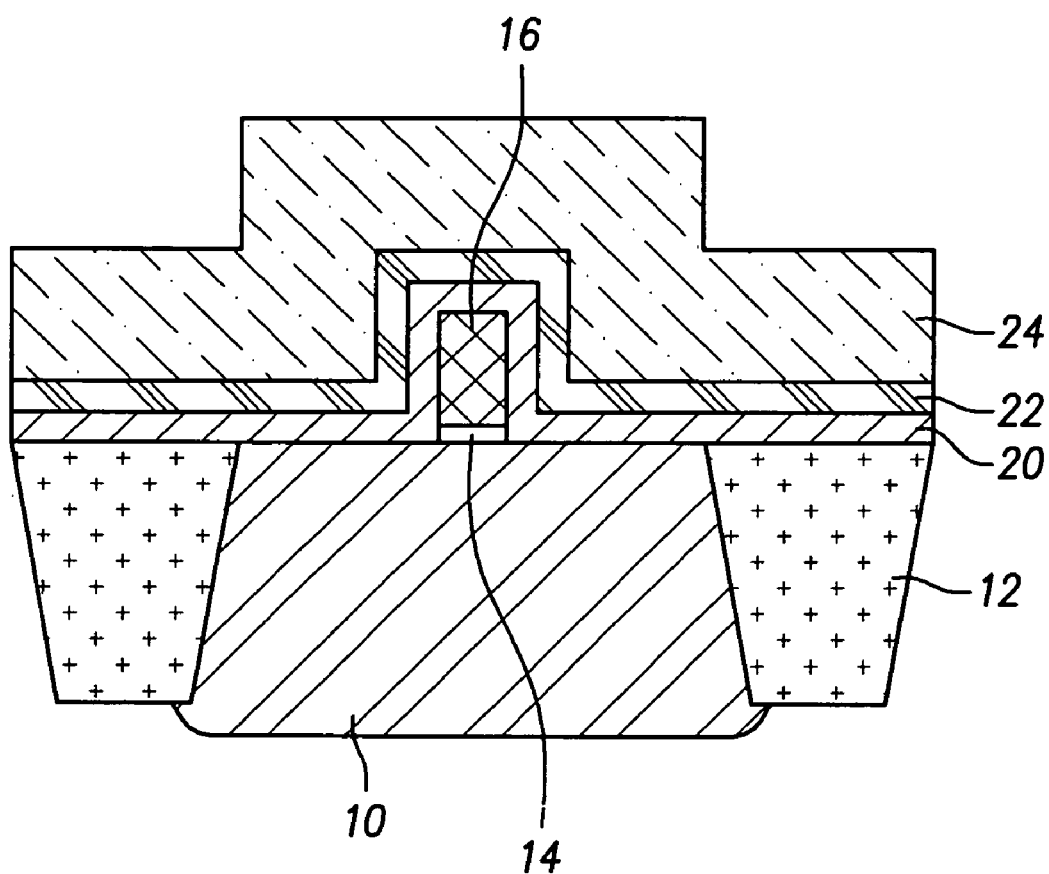

After forming the buffer oxide layer 20, a silicon nitride layer 22 is formed on the buffer oxide layer 20 to a thickness of about 200 Å (FIG. 1C). Then, as illustrated in FIG. 1D, impurities are implanted on the silicon nitride layer 22 by an ion implantation process. At this time, the impurity implanted into the silicon nitride layer 22 preferably comprises an element having the same number of valence electrons as silicon (of which the substrate 10 comprises), for example, Group IV elements on the Periodic Table (e.g., Si, Ge, Pb, Sn, Ti, Hf). If an element having a different number of valence electrons from the number of valence electrons of silicon is implanted, the impurities implanted in the ion implantation process of FIG. 1D may penetrate into the substrate 10 through the silicon nitride layer 22. In this case, the density of impurities of the previously formed LDD region and the density of impurities of a source drain diffusion region to be formed in a subsequent process can be affected. According to the present embodiment, germanium (Ge) is preferred as an impurity element to be implanted into the silicon nitride layer 22. Such impurities are generally implanted at an energy and at a dose (e.g., $10^{12}$-$10^{13}$ cm$^{-2}$) sufficient to impart a compressive stress on the silicon nitride layer, the gate electrode, and/or the substrate, without inadvertently implanting an amount or dose of impurities into the substrate having a significant adverse effect on the source/drain diffusion regions and/or the LDD regions of the PMOS device.

On the other hand, the impurities implanted into the silicon nitride layer 22 (for example, Ge) reduce the lattice constant of the silicon nitride layer. Referring to FIG. 1D, the crystal structure of the silicon nitride layer is changed due to the ion implantation of the impurities, which cause compressive stress A1 in the silicon nitride layer 22. Also, the compressive stress A1 faces the center of the gate electrode 16 and is transmitted to the substrate 10 through the buffer oxide layer 20. Therefore, compressive stress (A2) that faces a channel region B under a gate electrode 16 is generated in both regions of the substrate in which the source/drain diffusion regions are to be formed. As a result, the silicon lattice in the channel region B is compressed by the compressive stress A2, and the carrier mobility of the channel region B can be improved.

Then, the silicon nitride layer 22 and the buffer oxide layer 20 into which the impurities are implanted are etched by an etch back process so that gate spacers are formed on sidewalls of the gate electrode 16. Then, a common or conventional process for manufacturing the reminder of the semiconductor device is performed to form the final device.

Figure 1F:
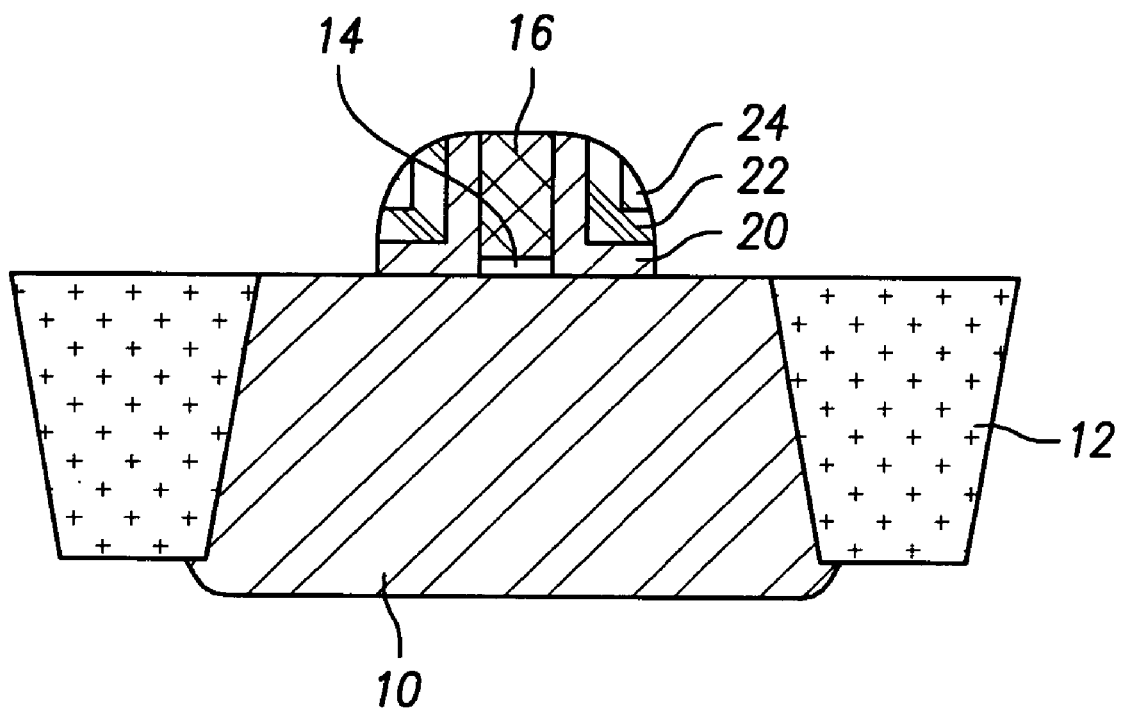

On the other hand, the above-described gate spacers have a double structure composed of or comprising the silicon oxide layer and the silicon nitride layer. However, the gate spacers may have a triple layer structure composed of or comprising a first (or lower) silicon oxide layer, a silicon nitride layer, and a second (or upper) silicon oxide layer on the silicon nitride layer. In this case, the silicon nitride layer 22 formed in FIG. 1C is formed to a minimum thickness (e.g., sufficient to impart a compressive stress on the substrate and/or improve a carrier mobility in the channel). After the process of implanting the impurities as illustrated in FIG. 1D, a silicon oxide layer 24 is (thickly) deposited, for example to a thickness of from about 200 Å to about 1500 Å (refer to FIG. 1E). Then, when an etch back process is performed, as illustrated in FIG. 1F, it is possible to form the triple structured gate spacer.

Figure 2A:
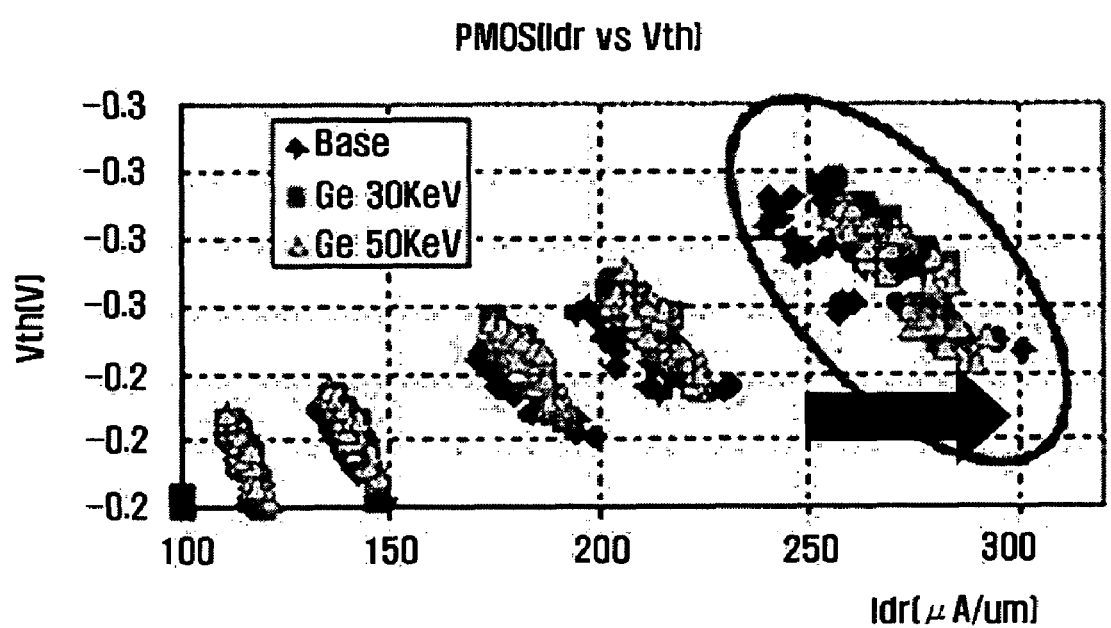
Figure 2B:
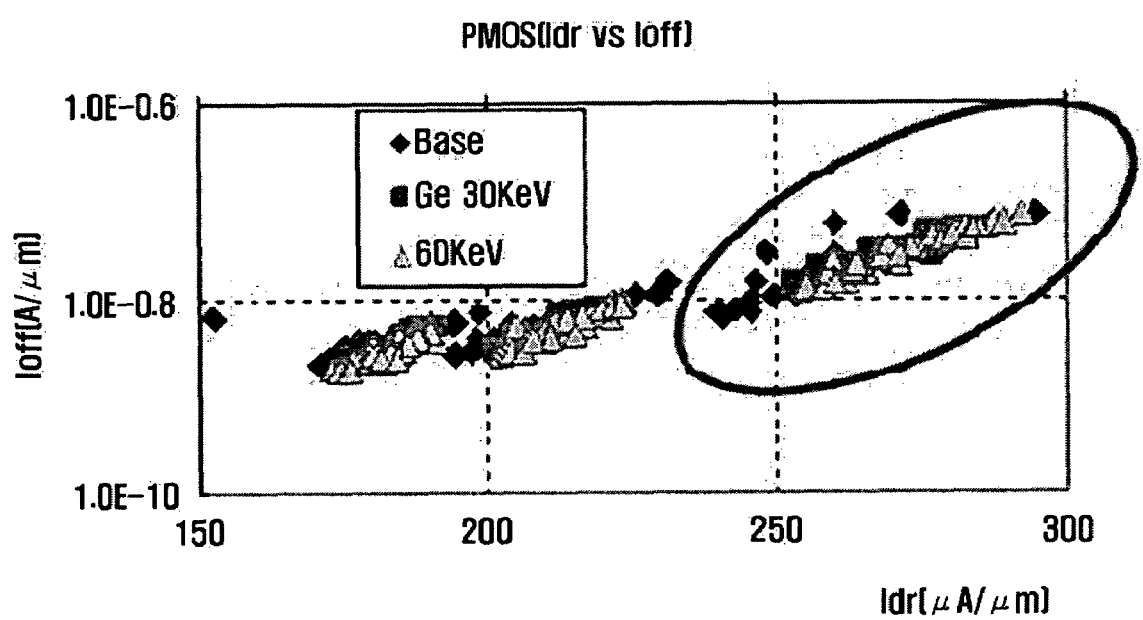

FIGS. 2A and 2B illustrate the electrical characteristic(s) of the PMOS device in which the compressive channel layer is formed. Here, 'Base' refers to the electrical characteristic of an otherwise identical PMOS device in which the compressive channel layer is not formed (i.e., in which Ge ions are not implanted into a silicon nitride layer from which a sidewall spacer is formed). 'Ge 30 Kev' and 'Ge 50 Kev' are the electrical characteristics of PMOS devices into which Ge is implanted at ion implantation energies of 30 KeV and 50 KeV, respectively. FIG. 2A plots the driving current (Idr) versus the gate threshold voltage (Vth) for such PMOS devices. When comparing the case where Ge is not implanted (Base) with the cases where Ge is implanted, where Ge is implanted, the value of driving current Idr is increased about 5% without a corresponding change in the gate threshold voltage Vth. Also, FIG. 2B illustrates results of measuring the current when the device is turned off (Ioff) versus the driving current (Idr). Comparing the case where Ge is not implanted (Base) with the cases where Ge is implanted, when Ge is implanted, the value of driving current Idr is increased about 5% without a corresponding change in the current Ioff.

According to the present invention, a compressive silicon channel layer is formed using the silicon nitride layer that forms a part of the gate spacers. In comparison with the case where a conventional Si—Ge epitaxial layer is used, the present process(es) are relatively simple, and it is possible to improve the performance of PMOS devices to about the same level as the level of a PMOS device made using a conventional Si—Ge epitaxial layer. In particular, according to the present invention, by only implanting impurities into the silicon nitride layer from which the gate spacers are formed, it is possible to significantly reduce the manufacturing cost of the device and improve the yield of the device in comparison with the conventional epitaxial Si—Ge method.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method of forming a PMOS device, the method comprising the steps of:
    forming a buffer oxide layer on a silicon semiconductor substrate having a gate oxide layer and a gate electrode thereon;
    forming a silicon nitride layer on the buffer oxide layer;
    implanting germanium (Ge) into the silicon nitride layer at an ion implantation energy of 30-50 KeV and at a dose of $10^{12}$-$10^{13}$ cm$^{-2}$, thereby compressing a channel region of the substrate below the gate electrode; and
    patterning the silicon nitride layer and the buffer oxide layer into which germanium is implanted, thereby forming gate spacers on sidewalls of the gate electrode.

2. The method of claim 1, wherein implanting the impurities compresses the silicon nitride layer.

3. A method of forming a PMOS device, the method comprising the steps of:
    forming a buffer oxide layer on a silicon semiconductor substrate having a gate oxide layer and a gate electrode thereon;
    forming a silicon nitride layer on the buffer oxide layer;
    implanting germanium (Ge) into the silicon nitride layer at an ion implantation energy of 30-50 KeV and at a dose of $10^{12}$-$10^{13}$ cm$^{-2}$ to compress the silicon nitride layer and a channel region of the substrate below the gate electrode; and etching the silicon nitride layer containing implanted germanium and the buffer oxide layer to form gate spacers on sidewalls of the gate electrode.

4. The method of claim 1, further comprising forming a silicon oxide layer on the silicon nitride layer.

5. The method of claim 4, wherein patterning the silicon nitride layer and the buffer oxide layer further comprises patterning the silicon oxide layer.

6. The method of claim 3, further comprising forming a silicon oxide layer on the silicon nitride layer.

7. The method of claim 6, wherein etching the silicon nitride layer and the buffer oxide layer further comprises etching the silicon oxide layer.

8. The method of claim 1, wherein forming the buffer oxide layer comprises forming the buffer oxide layer to a thickness of about 200 Å, and forming the silicon nitride layer comprises forming the silicon nitride layer to a thickness of about 200 Å.

9. The method of claim 3, wherein forming the buffer oxide layer comprises forming the buffer oxide layer to a thickness of about 200 Å, and forming the silicon nitride layer comprises forming the silicon nitride layer to a thickness of about 200 Å.

10. The method of claim 1, wherein implanting impurities into the silicon nitride layer increases a carrier mobility in the channel region.

11. The method of claim 3, wherein implanting impurities into the silicon nitride layer increases a carrier mobility in the channel region.

* * * * *